United States Patent [19]
Shieh

[11] Patent Number: 5,903,171
[45] Date of Patent: May 11, 1999

[54] SENSE AMPLIFIER WITH INTEGRATED LATCH AND LEVEL SHIFT

[75] Inventor: Je-Hurn Shieh, Cupertino, Calif.

[73] Assignee: Winbond Electronics Corporation, San Jose, Calif.

[21] Appl. No.: 08/865,076

[22] Filed: May 29, 1997

[51] Int. Cl.[6] .................................................. G11C 7/06
[52] U.S. Cl. ................................................. 327/55; 327/57
[58] Field of Search .................................... 327/57, 51, 52, 327/54, 55

[56] References Cited

U.S. PATENT DOCUMENTS

| | | | |
|---|---|---|---|
| 4,843,264 | 6/1989 | Galbraith | 327/55 |
| 5,192,878 | 3/1993 | Miyamoto | 327/51 |
| 5,502,680 | 3/1996 | Du et al. | 365/204 |
| 5,506,524 | 4/1996 | Lin | 327/54 |
| 5,508,644 | 4/1996 | Branson et al. | 327/51 |
| 5,729,159 | 3/1998 | Gersbach | 327/57 |

*Primary Examiner*—Toan Tran
*Attorney, Agent, or Firm*—Graham & James LLP

[57] ABSTRACT

A sense amplifier having an ingegrated latch with level shift is disclosed, in which a pair of cross-connected inverters are connected between the outputs of the sense amplifier to provide a single stage amplifier. The sense amplifier performs level shift, sense amplifier and latching functions within a single circuit, thus reducing layout area and simplifying chip design while at the same time providing full swing complementary outputs. In addition, the sense amplifier is turned on for only a portion of the cycle to enable the data to be latched, with virtually no constant current comsumption in the circuit for holding the data, thereby reducing power consumption. Alternative embodiments are disclosed using conventional and tri-state latches.

18 Claims, 4 Drawing Sheets

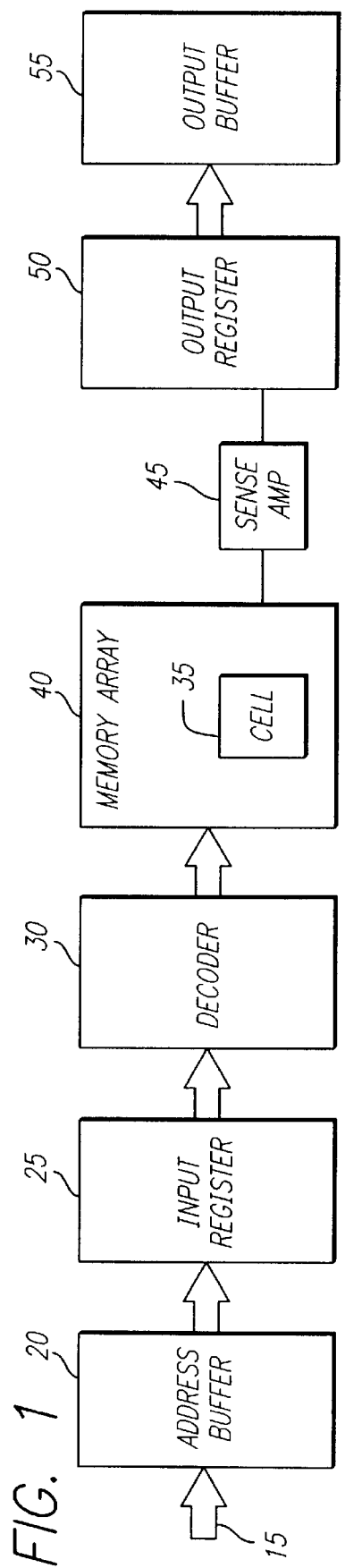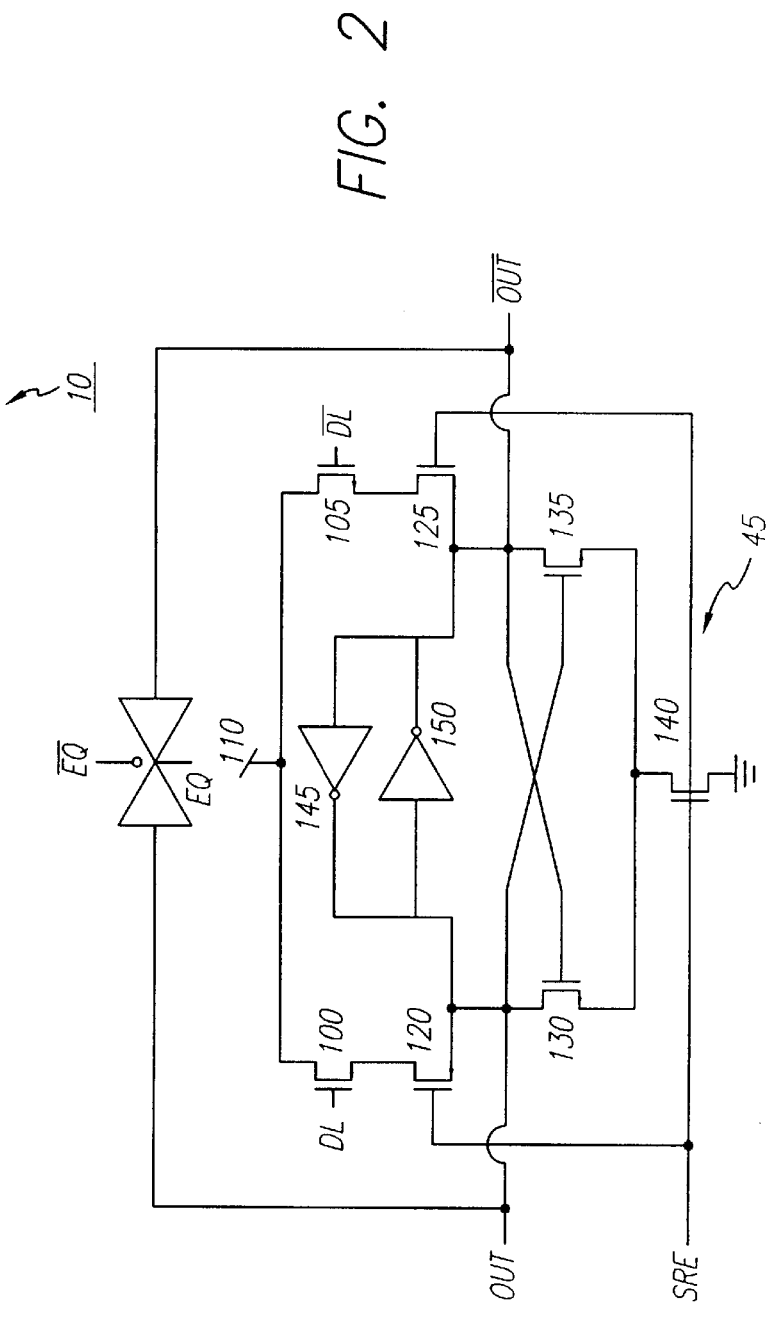

SENSE AMPLIFIER WITH INTEGRATED LATCH AND LEVEL SHIFT

FIELD OF THE INVENTION

The present invention relates generally to solid state circuits, and particularly relates to sense amplifiers for use in solid state circuits such as static RAM memory circuits.

BACKGROUND OF THE INVENTION

Random access memory, or RAM, comprises a key part of virtually every processor-based system. Numerous different RAM designs have been tried and found market acceptance. Recently, high density static RAM designs have been developed for use in workstations, personal computers, embedded systems and supercomputer main memory. As higher performance has been demanded by the application, various improvements to SRAM design have been developed, including synchronous wave-pipeline SRAM.

However, regardless of the type of RAM used, the data delay is still determined by the critical path from the address input to the data output. This path includes the address buffer, the input register, the decoder, the addressed memory cell, the sense amplifier, the output register and the output buffer.

New designs most commonly are intended to improve performance, either through reducing the delay time in the various stages, or to reduce either cost or power. One effective way to reduce cost is to reduce die size. Reductions in die size can be achieved either by improving the circuit or improving layout efficiency, or both. Power reductions can be achieved by reducing sense amplifier current or other techniques.

Various prior art designs have attempted to reduce sense amplifier current or otherwise improve sense amplifier performance. Several such designs are described in U.S. Pat. Nos. 5,544,110; 5,566,126; 5,526,314; 5,297,092; 5,294,847; 5,289,415; and 5,231,318. The basic operation of a sense amplifier in such a circuit includes not only the basic amplifier function, but also output latching and level shifting. In addition, a desirable design feature is to provide full swing at the outputs of the amplifier. These various functions are typically performed in multiple stages, as can be seen from the aforementioned patents, but as will be apparent from a review of these patents, attempting to incorporate these features has met with limited success and, in at least some instances such as the '110 and '126 patents, has led to complicated designs which increase the layout area or otherwise cause layout problems, and are therefore difficult to manufacture. In other instances, such as the '318 patent, the output is not permitted a full swing and remain sensitive to process variations. The '092 also presents serious design limitations, including the die area required for the two stage design, the need for precharging, and the fact that erroneous data can be latched. Likewise, the '847 patent presents problems with the amount of layout area needed for the excessive number of transistors in the design, the complicated control circuit, and the multiple stages. The '314 is also overly complicated and thus requires excessive layout area, as well as requiring precharging and presenting the possibility of latching the wrong data. A three stage amplifier is used in the '415 patent, which by itself leads to a complicated layout using excessive die area; in addition, the design suffers from excessive sensitivity during the clock high period.

As a result, there has been a need for a sense amplifier which offers small die area, low power consumption, positive latching, a full voltage swing at the outputs, and an uncomplicated design.

SUMMARY OF THE INVENTION

The present invention provides a simple, compact, low power design of a sense amplifier, which is particularly suited to use with SRAM memory cells including wave pipeline designs. The design of the present invention provides a latch integrated into the sense amplifier, which offers significantly reduced die area, reduced complexity, and lower power consumption. The present invention also provides substantially full voltage swing at the outputs together with level shifting, while at the same time latching the proper output data into a reliable state even after the sensing circuit has been turned off.

The invention includes an integrated latch which permits lower power operation of the sense amplifier, including the possibility of using pulsed power without loss of speed. The integrated latch requires less additional circuitry than a second stage, and thus reduces both complexity and layout area; the reduced complexity likewise leads to lower power consumption without sacrificing speed.

Two alternative embodiments are disclosed. During equalization, the latch is turned off. This cuts off any AC current, so that the output signal is stable. The delay chain in the second embodiment additionally ensures that the voltage swing developed by the sense amplifier will be sufficient to latch the output.

These and other features of the invention will be apparent from the following Detailed Description of the Invention, taken together with the Figures.

THE FIGURES

FIG. 1 shows in block diagram of a memory design according to the present invention.

FIG. 2 shows a first embodiment of a sense amplifier with an integrated latch according to the present invention.

DETAILED DESCRIPTION OF THE INVENTION

Figure 3:
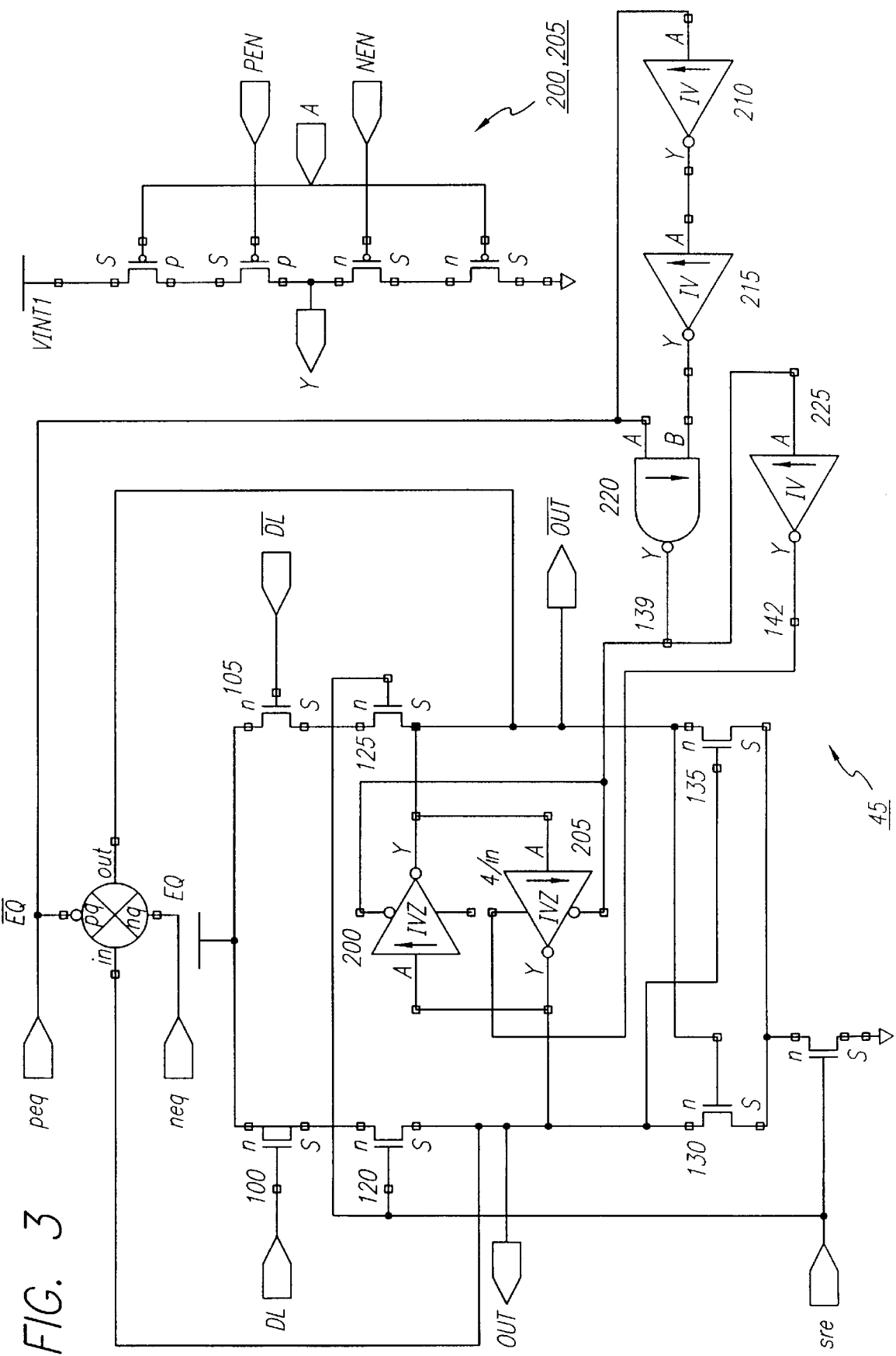
FIG. 3 shows a second embodiment of a sense amplifier with the integrated latch according to the present invention.

Referring first to FIG. 1, a memory system 10 according to the present invention is shown in block diagram form. An input 15 connects to an address buffer 20, which in turn connects to an input register 25. The input register 25 then transmits signals to a decoder 30, which addresses a memory cell 35 out of a much 35 larger memory array 40. The addressed memory cell 35 then provides an output from the memory array 40 to a sense amplifier 45. The sense amplifier 45, described in greater detail hereinafter, provides its stored information to an output register 50 and thence to an output buffer 55.

Referring next to FIG. 2, the illustrated sense amplifier 45 includes inputs DL and $\overline{DL}$ to the gates of input transistors 100 and 105, respectively. The drains of the transistors 100 and 105 are both connected to a voltage supply 110. The sources of the input transistors are in turn connected to the drains of a secondary pair of transistors 120 and 125, respectively. The gates of the transistors 120 and 125 are both connected to a signal SRE, and the sources of the transistors 120 and 125 are connected to the drains of a third pair of transistors 130 and 135. The gates and drains of the third pair of transistors 130 and 135 are cross-coupled, such that the source of the transistor 120 is connected to the gate of the transistor 135 while the source of the transistor 125 is connected to the gate of the transistor 130. Each of the three pairs of transistors is typically implemented as N-type transistors.

The sources of the transistors 130 and 135 are connected together and to ground through a transistor 140, also implemented as N-type.

A pair of inverters 145 and 150 are connected between the sources of the transistors 120 and 125, such that the output of the inverter 145 and the input of the inverter 150 are both connected to the source of the transistor 120, while the source of the transistor 125 is connected to the input of the inverter 145 and the output of the inverter 150. Both inverters typically switch on a positive-going transition, and serve as latches. The positive (OUT) and inverted ($\overline{OUT}$) outputs of the amplifier stage are taken from the sources of the transistors 120 and 125. It will be appreciated by those skilled in the art that the transistors 120 and 125 isolate the input signals $\overline{DL}$ and DL from the output signals OUT and $\overline{OUT}$ to generate a full swing output.

During the sensing period, the pulse signal SRE generated from the control circuits will go high, turning on transistors 120, 125 and 140. At the same time, the equalizing signals EQ and $\overline{EQ}$ will turn on at the pass gates to equalize the output signals OUT and $\overline{OUT}$ at the trigger point of both latches. After the input signals DL and $\overline{DL}$ achieve the necessary voltage difference—typically 80 mV to 120 mV—the sense amplifier will amplify that voltage difference to develop a voltage swing on the order of 250 mV to 300 mV. Once the amplified voltage swing has been developed, the SRE signal will go low and turn off transistors 120, 125 and 140. At the same time, the latches 145 and 150 will latch the signal and generate a full swing output signal for OUT and $\overline{OUT}$ based on the voltage swing developed by the sense amplifier. It will be appreciated that the sense amplifier turns off after the sensing period is over and the data has been latched into latches 145 and 150, such that no extra current is required to maintain the data. As a result, power in the chip can be dramatically reduced.

Referring next to FIG. 3, there is shown therein an alternative embodiment to the sense amplifier of FIG. 2. It will be appreciated that many of the elements of FIG. 3 are identical to those in FIG. 2, and for that reason like elements are identified by like reference numerals. The primary difference between the circuit of FIG. 3 and that of FIG. 2 is the use of tristate latches 200 and 205 instead of latches 145 and 150, together with a delay control circuit for turning on the tristate latches 200 and 205. The delay control circuit may, for example, comprise a pair of series-connected inverters 210 and 215 connected to one input of a nand gate 220, with a signal EQ from the equilization circuit providing the input to the inverter 210 and the second input to the nand gate 220, together with a third inverter 225 connected between the output of the nand gate 220. The output of the nand gate provides a signal to the inverting enable input of the tristate latches 200 and 205, while the output of the third inverter 225 provides the input to the non-inverting input of the latches 200 and 205.

The operation of the circuit of FIG. 3 is similar to that of FIG. 2, except that during the equalizing period, the tristate latch is turned off. This prevents data "fighting" within the latch, and reduce some AC power consumption during the sensing period. When the output voltage swing has developed sufficiently on the OUT and $\overline{OUT}$ lines, the sense amplifier is turned off and the tristate latch is turned on to latch the data at its full voltage swing. The delay control circuit is used to ensure that a proper voltage swing is permitted to develop during the period between the equalizing signals being turned off and the tristate latch being turned on.

Figure 4:
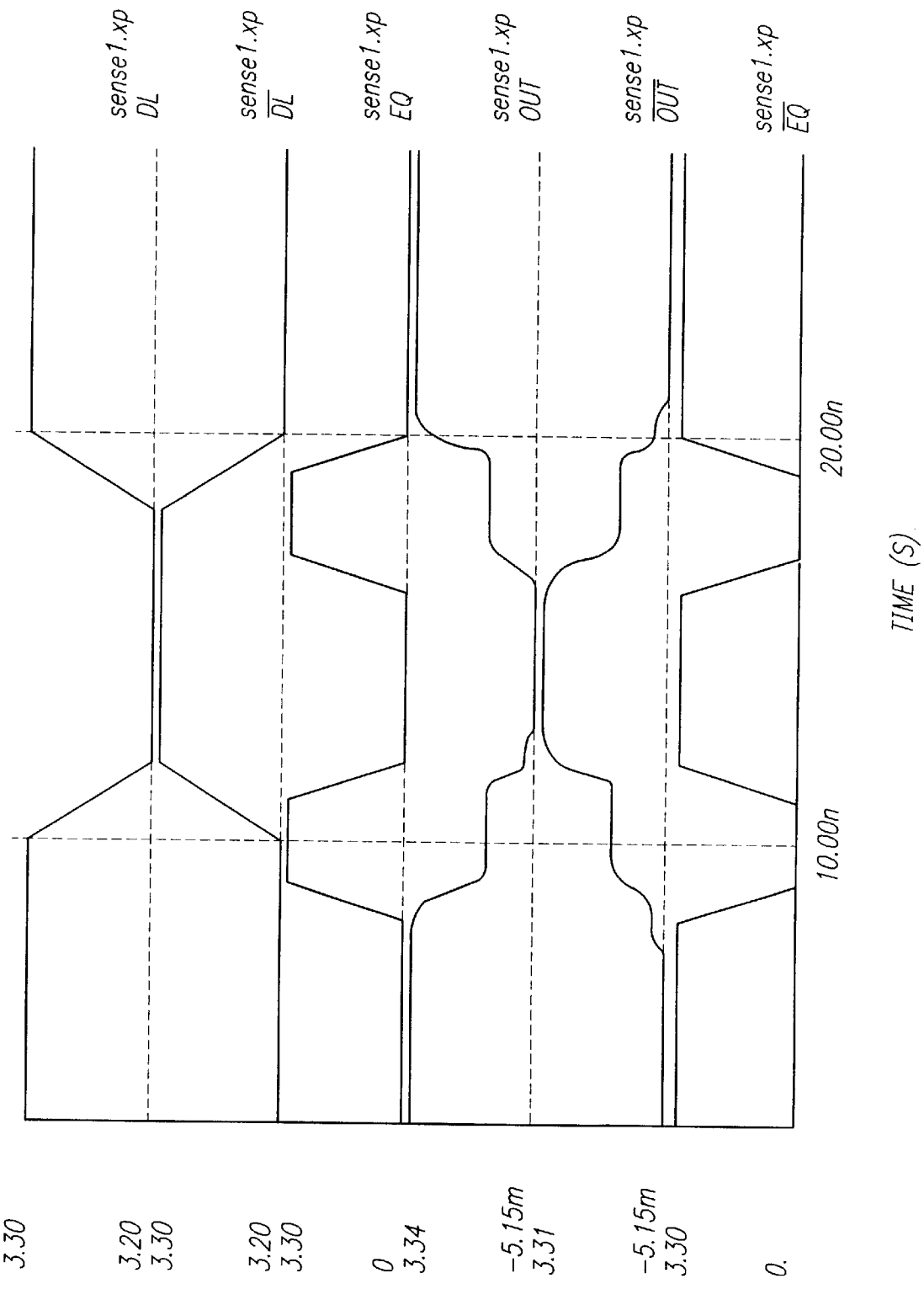
FIG. 4 shows the response of the sense amplifier of FIGS. 2 or 3 to varying input signals.

To fully appreciate the operation of the sense amplifiers of both FIG. 2 and FIG. 3, the outputs of the sense amplifiers are shown in FIG. 4 in response to changes in the various other signals, including DL and $\overline{DL}$, PEQ, NEQ, $\overline{OUT}$, OUT and SRE.

Figure 5:
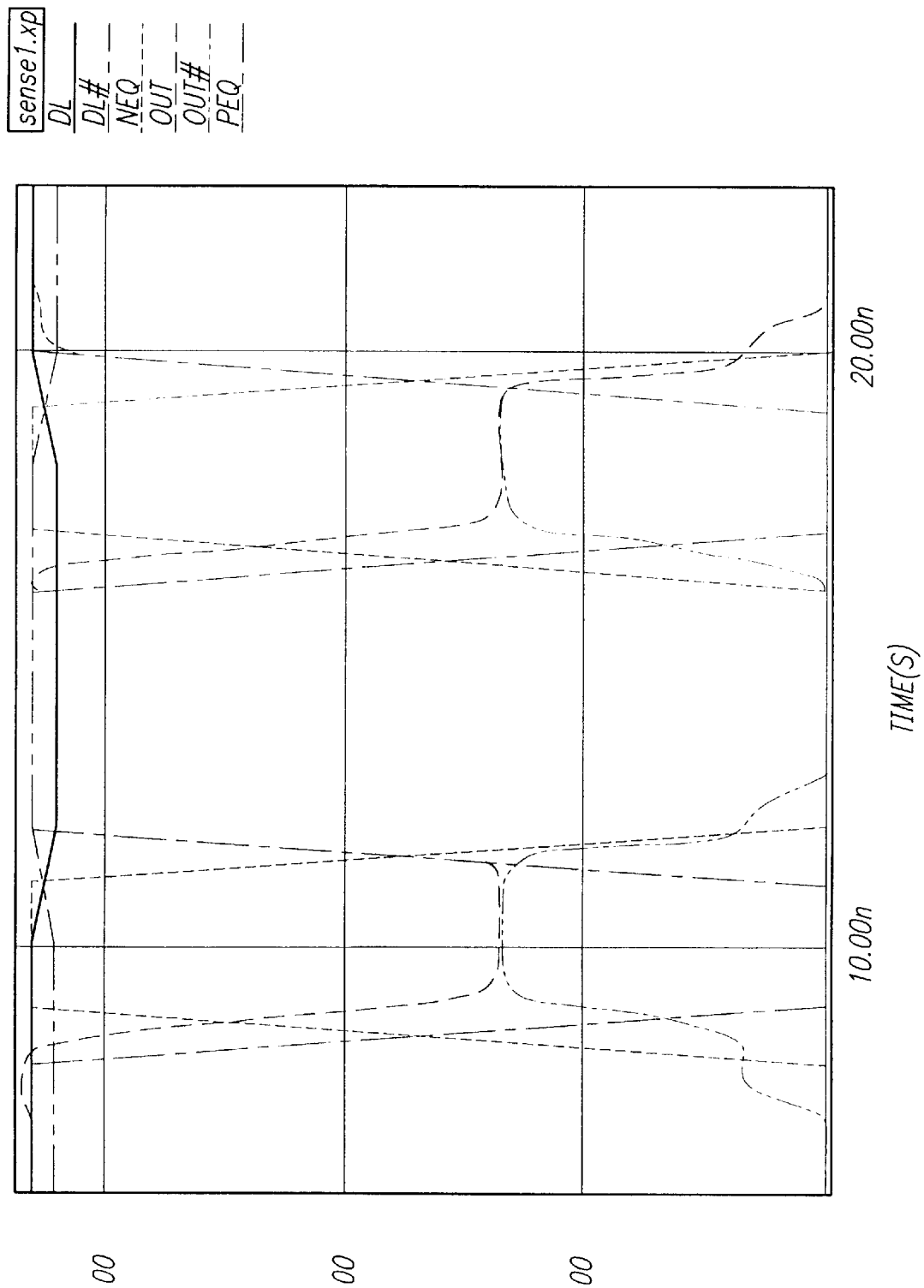
FIG. 5 shows a simulation result for the embodiment of FIG. 2.

In addition, FIG. 5 shows the results of a simulation of the circuit of FIG. 2, and in particular shows outputs $\overline{OUT}$ and OUT in response to various inputs including DL, $\overline{DL}$, NEQ, PEQ and SRE. It will be appreciated by those skilled in the art, given the teachings herein, that the sense amplifier design disclosed herein is compatible with RAM designs using pulsed word lines.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

I claim:
1. A sense amplifier, comprising:
   a first pair of transistors each having an input and a pair of terminals, a first terminal of each transistor of the first pair being connected to a supply voltage, the input of a first transistor of the first pair for receiving an uninverted input signal and the input of a second transistor of the first pair for receiving an inverted input signal,
   a second pair of transistors,
   an inverted output and an uninverted output, a first transistor of the second pair being directly connected between the uninverted output and a second terminal of the first transistor in the first pair, a second transistor of the second pair being directly connected between the inverted output and a second terminal of the second transistor in the first pair, and
   a pair of inverters connected inversely to each other and being connected between the uninverted output and the inverted output.
2. A sense amplifier, comprising:
   a first pair of transistors each having an input and a pair of terminals, a first terminal of each transistor of the first pair being connected to a supply voltage, the input of a first transistor of the first pair for receiving an uninverted input signal and the input of a second transistor of the first pair for receiving an inverted input signal,
   a second pair of transistors,
   an inverted output and an uninverted output, a first transistor of the second pair being directly connected between the uninverted output and a second terminal of the first transistor in the first pair, a second transistor of the second pair being directly connected between the inverted output and a second terminal of the second transistor in the first pair, and
   a pair of inverters connected inversely to each other and being connected between the uninverted output and the inverted output, the pair of inverters being configured to form a latch, and delay logic connected to set and reset portions of each of the inverters in the pair.

3. The sense amplifier of claim 1 in which an equalization circuit is connected between the inverted and uninverted outputs for generating at least one equalization signal.

4. The sense amplifier of claim 3 in which the pair of inverters form a latch, and in which the latch is turned off when the at least one equalization signal is generated.

5. A sense amplifier, comprising:

a first pair of transistors each having an input and a pair of terminals, a first terminal of each transistor of the first pair being connected to a supply voltage, the input of a first transistor of the first pair for receiving an uninverted input signal and the input of a second transistor of the first pair for receiving an inverted input signal, a second pair of transistors, an inverted output and an uninverted output, a first transistor of the second pair being directly connected between the uninverted output and a second terminal of the first transistor in the first pair, a second transistor of the second pair being directly connected between the inverted output and a second terminal of the second transistor in the first pair, and a pair of inverters connected inversely to each other and being connected between the uninverted output and the inverted output, the pair of inverters being configured to form a latch.

6. The sense amplifier of claim 5 further including delay logic connected to set reset portions of each of the inverters in the pair.

7. The sense amplifier of claim 1 in which the second pair of transistors forms a single stage amplifier.

8. The sense amplifier of claim 1 in which the first and second pairs of transistors and the inverters cooperate to perform level shift, sense amplification and latching in a single circuit.

9. The sense amplifier of claim 1 in which the inverters provide complementary outputs.

10. The sense amplifier of claim 1 wherein the second pair of transistors is turned off following latching of output signals at the uninverted and inverted outputs, respectively, to thereby substantially reduce the current required in the amplifier for holding the output signals at their respective levels.

11. The sense amplifier of claim 1, in which the first and second pairs of transistors are of an n-channel type.

12. The sense amplifier of claim 2, in which the first and second pairs of transistors are of an n-channel type.

13. The sense amplifier of claim 5, in which the first and second pairs of transistors are of an n-channel type.

14. A sense amplifier, comprising:

a first pair of transistors each having an input and a pair of terminals, a first terminal of each transistor of the first pair being connected to a supply voltage, the input of a first transistor of the first pair for receiving an uninverted input signal and the input of a second transistor of the first pair for receiving an inverted input signal, a second pair of transistors, an inverted output and an uninverted output, a first transistor of the second pair being directly connected between the uninverted output and a second terminal of the first transistor in the first pair, a second transistor of the second pair being directly connected between the inverted output and a second terminal of the second transistor in the first pair, a latch disposed between the uninverted output and the inverted output, and a third pair of transistors cross-coupled to each other and together being disposed between the uninverted output and the inverted output parallel to the latch, wherein the first pair of transistors performs level shifting, the second and third pairs of transistors perform sense amplification and output signals developing at the uninverted and inverted outputs, respectively, and the latch latches the output signals.

15. The sense amplifier of claim 11, in which the latch includes a pair of inverters connected inversely to each other.

16. The sense amplifier of claim 11, in which the latch includes a pair of tri-state latches connected inversely to each other.

17. The sense amplifier of claim 13, wherein the tri-state latches have enable inputs, the sense amplifier further including:

a delay control circuit coupled to the enable input of each of the tri-state latches, wherein the delay control circuit is for permitting development of the output signals.

18. The sense amplifier of claim 14, in which the first, second and third pairs of transistors are of an n-channel type.

* * * * *